(12) United States Patent
Foong et al.

(10) Patent No.: US 9,177,834 B2
(45) Date of Patent: Nov. 3, 2015

(54) POWER BAR DESIGN FOR LEAD FRAME-BASED PACKAGES

(71) Applicants: Chee Seng Foong, Sg. Buloh (MY); Meng Kong Lye, Shah Alam (MY); Lan Chu Tan, Singapore (SG); Seng Kiong Teng, Shah Alam (MY)

(72) Inventors: Chee Seng Foong, Sg. Buloh (MY); Meng Kong Lye, Shah Alam (MY); Lan Chu Tan, Singapore (SG); Seng Kiong Teng, Shah Alam (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 47 days.

(21) Appl. No.: 14/184,672

(22) Filed: Feb. 19, 2014

(65) Prior Publication Data
US 2015/0235924 A1   Aug. 20, 2015

(51) Int. Cl.
*H01L 23/495* (2006.01)
*H01L 21/56* (2006.01)
*H01L 23/31* (2006.01)
*H01L 23/00* (2006.01)

(52) U.S. Cl.
CPC ............ *H01L 21/56* (2013.01); *H01L 23/3107* (2013.01); *H01L 23/49541* (2013.01); *H01L 24/85* (2013.01); *H01L 2224/85* (2013.01); *H01L 2924/181* (2013.01)

(58) Field of Classification Search
CPC .................. H01L 23/49503; H01L 23/49541; H01L 23/49551; H01L 24/49; H01L 23/49548; H01L 24/83; H01L 21/565; H01L 23/50; H01L 24/85; H01L 2224/49171; H01L 2224/83136; H01L 2924/01046; H01L 2924/14; H01L 2924/18301; H01L 2924/3025; H01L 2224/85; H01L 24/48
See application file for complete search history.

(56) References Cited

U.S. PATENT DOCUMENTS

| | | |
|---|---|---|
| 6,818,973 B1 | 11/2004 | Foster |
| 7,543,249 B2 | 6/2009 | Redorta |
| 7,737,537 B2 * | 6/2010 | Bemmerl et al. ............. 257/670 |
| 7,875,963 B1 * | 1/2011 | Kim et al. ..................... 257/670 |
| 8,030,741 B2 | 10/2011 | Bemmerl |
| 8,143,914 B2 | 3/2012 | Ogata |
| 8,188,579 B1 | 5/2012 | Kim |
| 8,575,742 B1 | 11/2013 | Kim |
| 2005/0121753 A1 | 6/2005 | Lee |
| 2009/0152694 A1 * | 6/2009 | Bemmerl et al. ............. 257/670 |
| 2012/0113609 A1 * | 5/2012 | Park et al. .................... 361/767 |

FOREIGN PATENT DOCUMENTS

EP   1944802   7/2008

* cited by examiner

*Primary Examiner* — Dung Le
(74) *Attorney, Agent, or Firm* — Charles Bergere

(57) ABSTRACT

A semiconductor device includes a semiconductor die encapsulated in a package casing and having four main side walls each oriented generally parallel with one of first or second orthogonal directions. Signal leads are electrically coupled to the die and each has an exposed portion that extends from one of the main side walls parallel with one of the first or second directions. One or more power bars are electrically coupled to the die and each has at least one power bar lead extending at a non-zero angle with respect to the first and second directions. The power bars and associated power bar leads are electrically isolated from the signal leads. One or more tie bars extends at a generally non-zero angle with respect to the first and second directions and is electrically isolated from the signal leads and the power bars and associated power bar leads.

8 Claims, 3 Drawing Sheets

POWER BAR DESIGN FOR LEAD FRAME-BASED PACKAGES

BACKGROUND OF THE INVENTION

The present invention is directed to a semiconductor device and method of assembling semiconductor devices from a lead frame and power bar that are adaptable to different package designs.

Lead frames utilizing power bars are typically designed to meet specific integrated circuit (IC) configurations. Thus, such lead frames are specific in application and not generally adaptable to different device specifications. For example, devices with different power pad locations require new lead frame designs. Design and tooling costs, and ultimately unit costs, become higher as a result of the need for specific lead frame configurations. Individualized power bar designs also limit the ability to reuse technology, handicap corporate complexity reduction, and prohibit economy of scale in purchasing. This leads to lost opportunities to save costs.

The current lead frame and power bar designs also pose an issue with the advancement of integrated circuit packaging. For example, quad-flat packaging (QFP) has the lowest cost per input/output (I/O) pin in package platforms, and is therefore used in as many new devices as possible. However, the number of signal, power, and ground I/O pins continues to rise with each generation of IC. Unfortunately, the QFP lead frame designs have not advanced at the same rate with I/O pin demand. If this trend continues, newer generation ICs will be forced into higher cost platforms. One issue with conventional lead frame/power bar designs is that the power bar relies on the sacrifice of usable inner leads for structural support and electrical connectivity.

It is therefore desirable to provide a lead frame design utilizing power bars that is adaptable for use with numerous types of IC configurations and pins and also does not sacrifice inner signal leads.

BRIEF DESCRIPTION OF THE SEVERAL VIEWS OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION OF THE INVENTION

Figure 1:
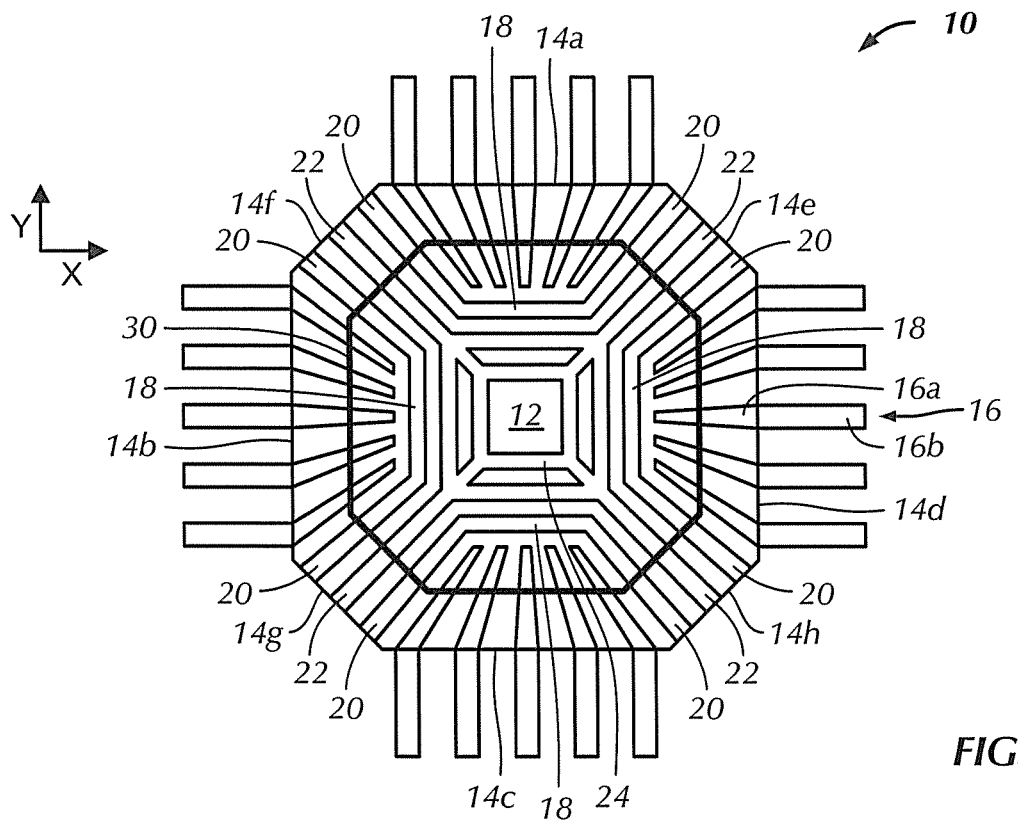
FIG. 1 is a top plan partially cut-away view of a semiconductor device in accordance with a first embodiment of the invention.

In one embodiment, the present invention provides a semiconductor device that includes a semiconductor die and a package casing encapsulating the semiconductor die and lying in a plane defined by first and second orthogonal directions. The package casing has four main side walls each oriented generally parallel with one of the first or second directions. A plurality of signal leads are electrically coupled to the semiconductor die and each has an embedded portion located within the package casing and an exposed portion extending from one of the main side walls of the package casing in a direction generally parallel with one of the first or second directions. One or more power bars are electrically coupled to the semiconductor die and are embedded in the package casing. Each of the one or more power bars extends generally parallel to one of the first or second directions. Each of the one or more power bars has at least one power bar lead at least partially embedded in the package casing and extending from the power bar at a generally non-zero angle with respect to the first and second directions. The one or more power bars and associated power bar leads are electrically isolated from the plurality of signal leads. Each of one or more tie bars is at least partially embedded in the package casing and extends at a generally non-zero angle with respect to the first and second directions. The one or more tie bars are electrically isolated from the plurality of signal leads and the one or more power bars and associated power bar leads.

In another embodiment, the invention provides a method of assembling a semiconductor device. The method includes providing a lead frame configured to lie in a plane defined by first and second orthogonal directions. The lead frame includes a plurality of signal leads each having an end portion extending in a direction parallel to one of the first or second directions, one or more power bars each extending in a direction parallel to one of the first or second directions and having at least one power bar lead extending therefrom at a generally non-zero angle with respect to the first and second directions, and one or more tie bars each extending at a generally non-zero angle with respect to the first and second directions. Each of the one or more tie bars is connected to at least one of the power bar leads by a dam bar. The method further includes electrically coupling a semiconductor die to each of the plurality of signal leads and each of the one or more power bars, and forming a package casing that encapsulates the semiconductor die, the one or more power bars, a portion of each of the plurality of signal leads, and at least a portion of each of the one or more tie bars and power bar leads. The package casing is formed to have four main side walls each oriented generally parallel with one of the first or second directions such that the end portion of each of the signal leads extends from one of the main side walls of the package casing, and such that each dam bar connecting one of the one or more tie bars to at least one of the power bar leads lies outside of the package casing. The method also includes severing each dam bar such that the one or more tie bars are electrically isolated from the plurality of signal leads and the one or more power bars and associated power bar leads.

Referring now to the drawings, wherein the same reference numerals are used to designate the same components throughout the several figures, there is shown in FIG. 1 a semiconductor device 10 in accordance with a first embodiment of the invention. The semiconductor device 10 includes a semiconductor die 12 that is typically in the form of an integrated circuit (IC) or the like. The semiconductor die 12 may be made from any semiconductor material or combinations of materials, such as gallium arsenide, silicon germanium, silicon-on-insulator (SOI), silicon, monocrystalline silicon, the like, and combinations of the above. Further, the die 12 may implement various types of circuits, such as a processor, a controller, a System on a Chip, or the like, and the circuit may have one or more different power domains.

The semiconductor device 10 further includes a package casing 14 that encapsulates or covers the semiconductor die 12. The package casing 14 is preferably formed from a mold compound, such as a polymeric material or the like, as is known in the art. In plan view, the package casing 14 preferably has a generally square or rectangular shape, preferably with chamfered corners. That is, the package casing 14 preferably lies in a plane defined by first and second orthogonal directions X, Y and has four main side walls 14a, 14b, 14c, 14d each oriented generally parallel with one of the first or second directions X, Y. Further preferably, the package casing 14 includes four corner side walls 14e, 14f, 14g, 14h, each of which connects to two adjacent main side walls 14a, 14b, 14c, 14d of the package casing 14 and extends at a generally non-zero angle with respect to the first and second directions X, Y. Although the drawing shows a QFP type package, embodiments of the invention are equally applicable to other package shapes and orientations, and the description herein of the shape of the package casing 14 should not be considered limiting. Furthermore, the size of the corner side walls may be exaggerated in the drawings, for illustrative purposes.

The semiconductor die 12 is preferably electrically coupled to a plurality of signal leads 16. Each of the signal leads 16 is preferably made from a conductive material, such as copper (Cu), aluminum (Al), or the like. The plurality of signal leads 16 may also be coated, alloyed, or pre-plated with a metal layer or layers such as silver (Ag), gold (Au), nickel (Ni), palladium (Pd), tin (Sn), or the like. However, other materials may be used for the signal leads 16. The number and shapes of the signal leads 16 may be varied as necessary depending on the end use configurations and other such factors. In particular, each signal lead 16 preferably has an embedded portion 16a located within the package casing 14 and an exposed portion 16b extending from one of the main side walls 14a, 14b, 14c, 14d of the package casing 14 in a direction generally parallel with one of the first or second directions X, Y.

The semiconductor device 10 preferably further includes one or more power bars 18 (four shown in FIG. 1) that are also electrically coupled to the semiconductor die 12 and are embedded in the package casing 14. The power bars 18 are preferably made from the same or similar material as the signal leads 16 (e.g., copper, aluminum, plated copper, or the like). Preferably, each of the power bars 18 extends generally parallel to one of the first or second directions X, Y proximate to the semiconductor die 12. In this way, different pad configurations (not shown) on the semiconductor die 12 may be accommodated for the supply of power.

Each of the power bars 18 also preferably has at least one power bar lead 20 at least partially embedded in the package casing 14 and extending from the power bar 18 at a generally non-zero angle with respect to the first and second directions X, Y. In the example shown in FIG. 1, the semiconductor device 10 includes four power bars 18, each having two power bar leads 20 (one on each end) connected thereto which extend toward adjacent corner side walls 14e, 14f, 14g, 14h of the package casing 14. As a result, the power bars 18 do not require structural support from, nor electrical connection to, any of the signal leads 16. Therefore, the power bars 18 and associated power bar leads 20 may be electrically isolated from the plurality of signal leads 16, all of which can be used for signal I/O to the semiconductor die 12 instead of being sacrificed for power.

The semiconductor device 10 also preferably includes one or more tie bars 22 (four shown in FIG. 1). The tie bars 22 may connect to a central support 24, such as a die flag or the like on which the semiconductor die 12 may be mounted. The tie bars 22 are preferably made from the same or similar material as the signal leads 16 and the power bars 18 (e.g., copper, aluminum, or the like). Each tie bar 22 is at least partially embedded in the package casing 14 and extends, preferably from the central support 24, at a generally non-zero angle with respect to the first and second directions X, Y. In the example shown in FIG. 1, the semiconductor device 10 includes four tie bars 22, each extending toward adjacent corner side walls 14e, 14f, 14g, 14h of the package casing 14.

Preferably the tie bars 22 are electrically isolated from the signal leads 16, the power bars 18, and the associated power bar leads 20. In the example shown in FIG. 1, the tie bars 22 extend parallel to and between adjacent power bar leads 20. Since the tie bars 22 are not required to support or electrically connect to the power bars 18, the tie bars 22 can be grounded, if desired.

Figure 2:
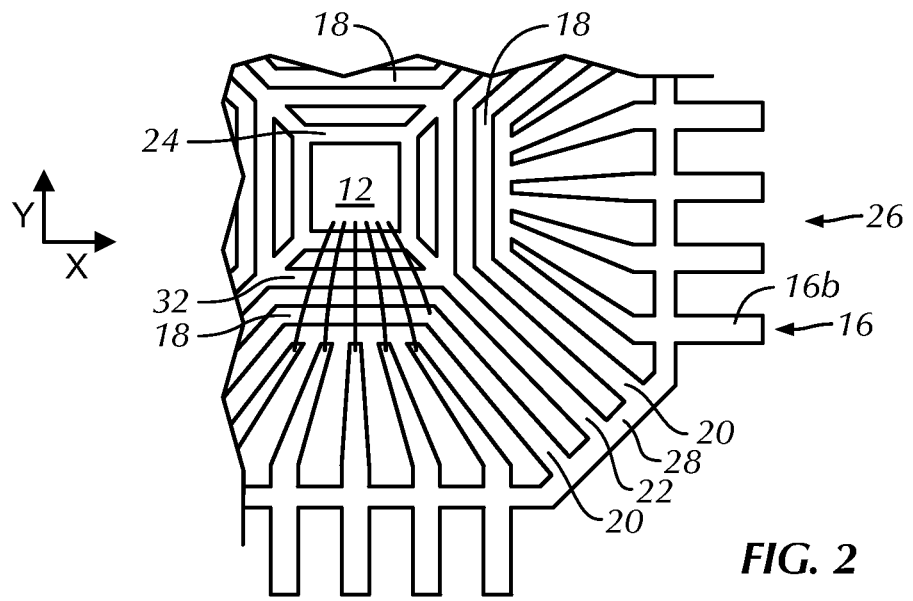
FIG. 2 is a partial top plan view of a lead frame and semiconductor die for use in the semiconductor device of FIG. 1.

A method of making assembling the semiconductor device 10 will now be described with reference to FIGS. 2-3. In FIG. 2, a lead frame 26 is provided and configured to lie in the plane defined by the first and second directions X, Y. The lead frame 26 preferably includes the signal leads 16, the power bars 18, power bar leads 20, and the tie bars 22. To provide the final orientation with respect to the package casing 14 that is formed, end portions (e.g., 16b) of the signal leads 16 are oriented parallel to one of the first or second directions X, Y, as are the power bars 18, while the power bar leads 20 and tie bars 22 are each oriented to extend at generally non-zero angles with respect to the first and second directions X, Y.

Each tie bar 22 is preferably coupled to one or more of the power bar leads 20 by a dam bar 28 of the lead frame 26. This allows for structural stability prior to assembly and generally does not form a part of the completed semiconductor device 10. The dam bar 28 may be made from the same material as the power bar leads 20 and the tie bars 22 (e.g., copper, aluminum, or the like) since the dam bar 28 is severed during assembly.

For added structural support during assembly, a dielectric tape 30 (FIG. 1) may be applied to physically connect the signal leads 16, the power bar leads 20, and the tie bars 22 to one another. The dielectric tape 30 may be of any suitable type, such as Kapton tape, commercially available from E. I. du Pont de Nemours and Company of Wilmington, Del. The dielectric tape 30 aids in maintaining the spacing among the signal leads 16, the power bar leads 20, and the tie bars 22 against forces generated during assembly.

The semiconductor die 12 is attached to the lead frame 26, preferably to the central support 24. The semiconductor die 12 is preferably bonded to the central support 24 using an adhesive, such as an epoxy material. However, other methods of securing the semiconductor die 12 to the central support 24 may be used, such as tape, mechanical or other fasteners, or the like.

Contacts (not shown) of the semiconductor die 12 are then electrically coupled to each of the signal leads 16 and the power bars 18. The electrical coupling is preferably made with wires 32 through a conventional wire bonding process. However, direct coupling of the signal leads 16 and power bars 18 to the semiconductor die 12 are also contemplated. The wires 32 are preferably in the form of copper or gold wires, although plated wires (e.g., copper plated with palladium) such as materials may be used. The tie bars 22 mal also be electrically coupled to the semiconductor die 12, as necessary, for example, through the central support 24 or by a wire (not shown) for grounding purposes.

Figure 3:
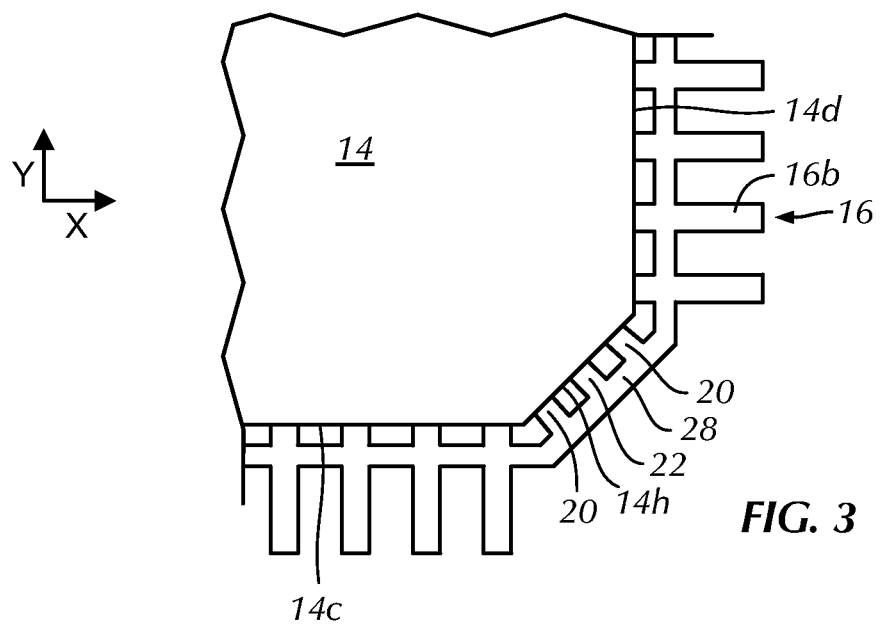
FIG. 3 is a partial top plan view of the structure of FIG. 2 following formation of a package casing.

Referring to FIG. 3, the package casing 14 is formed to encapsulate the semiconductor die 12, the power bars 18, a portion of each of the signal leads 16, and at least a portion of the tie bars 22 and power bar leads 20. The package casing 14 may be formed by liquid encapsulation, compression molding, or the like, followed by curing. The main side walls 14a, 14b, 14c, 14d of the package casing 14 are formed such that the exposed end portions 16b of the signal leads 16 extend therefrom. Further preferably, the dam bars 28 lie outside of the package casing 14 upon formation thereof. Preferably, the dam bars 28 abut or are at least adjacent to the corner side walls 14e, 14f, 14g, 14h of the package casing 14.

Referring back to FIG. 1, following formation of the package casing 14, the dam bars 28 are all severed to electrically isolate the tie bars 22 from the signal leads 16 and the power bars 18. In the embodiment shown in FIG. 1, the tie bars 22 and power bar leads 20 are further trimmed to be flush with the respective corners 14e, 14f, 14g, 14h of the package casing 14.

Figure 4:
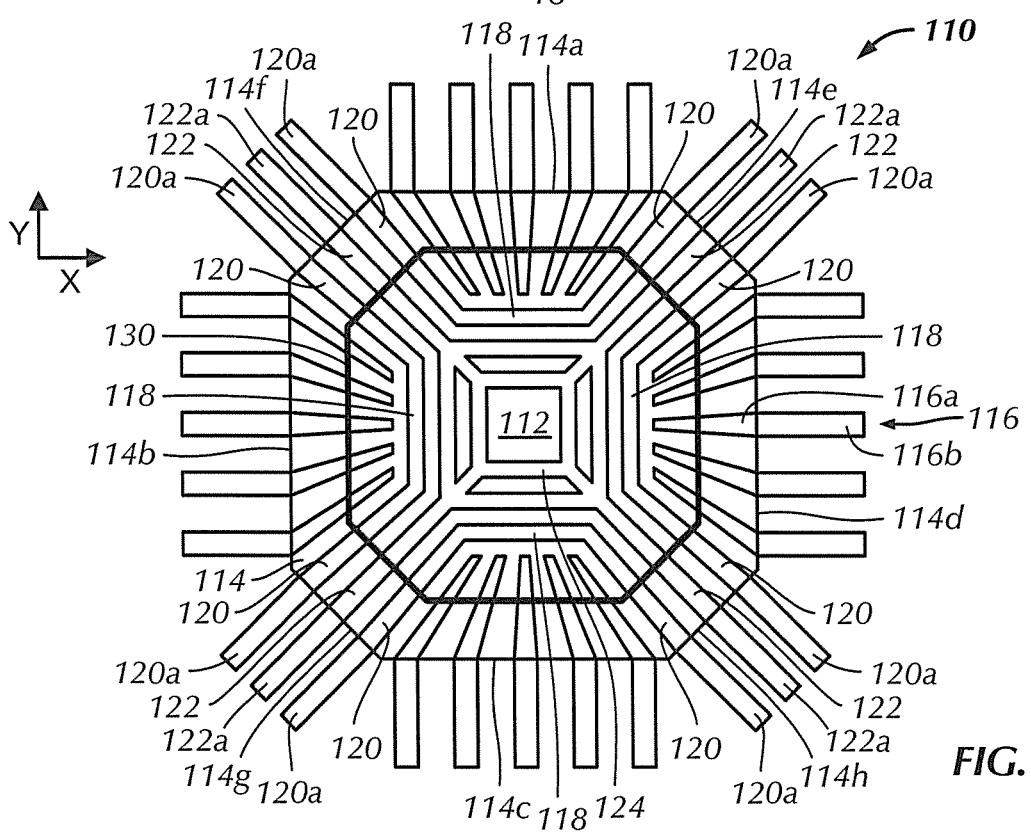
FIG. 4 is a top plan partially cut-away view of a semiconductor device in accordance with a second embodiment of the invention.

FIG. 4 shows a semiconductor device 110 in accordance with a second embodiment of the invention. The second embodiment is similar to the first embodiment described above. Like numerals have been used for like elements, except the 100 series numerals have been used for the second embodiment. Accordingly, a complete description of the second embodiment has been omitted, with only the differences being described.

In the second embodiment, the tie bars 122 and the power bar leads 120 each have exposed portions 122a, 120a that extend outside of the package casing 114, preferably from the corner side walls 114e, 114f, 114g, 114h thereof. The exposed portion 120a of each power bar lead 120 preferably forms a power I/O connection to the corresponding power bar 118. Moreover, the exposed portion 122a of each tie bar 122 may be used as a ground I/O connection for the semiconductor device 110. Essentially, the exposed portion 120a, 122a of the power bar leads 120 and the tie bars 122 can serve as external leads without sacrificing any of the signal leads 116.

Figure 5:
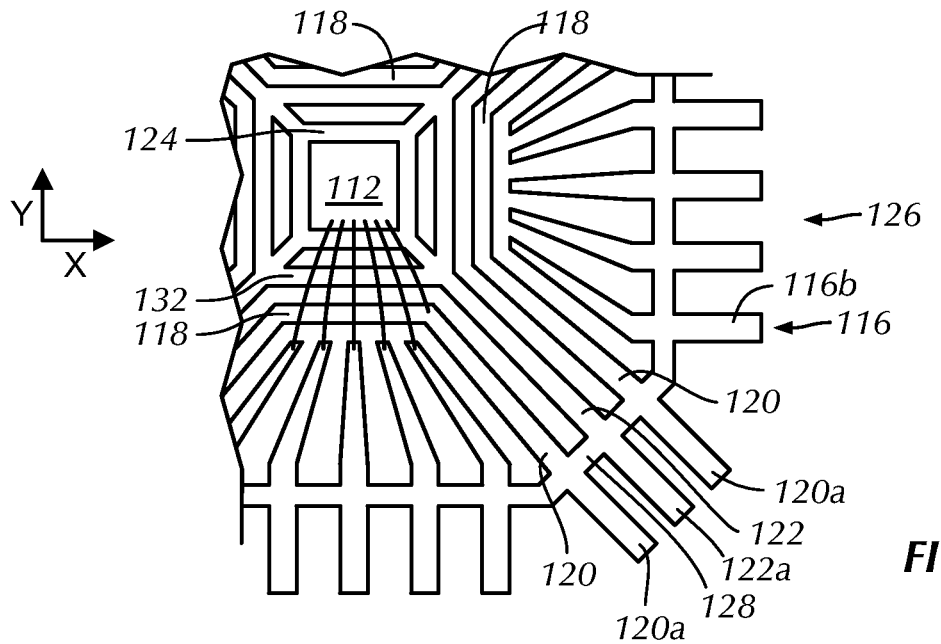
FIG. 5 is a partial top plan view of a lead frame and semiconductor die for use in the semiconductor device of FIG. 4.
Figure 6:
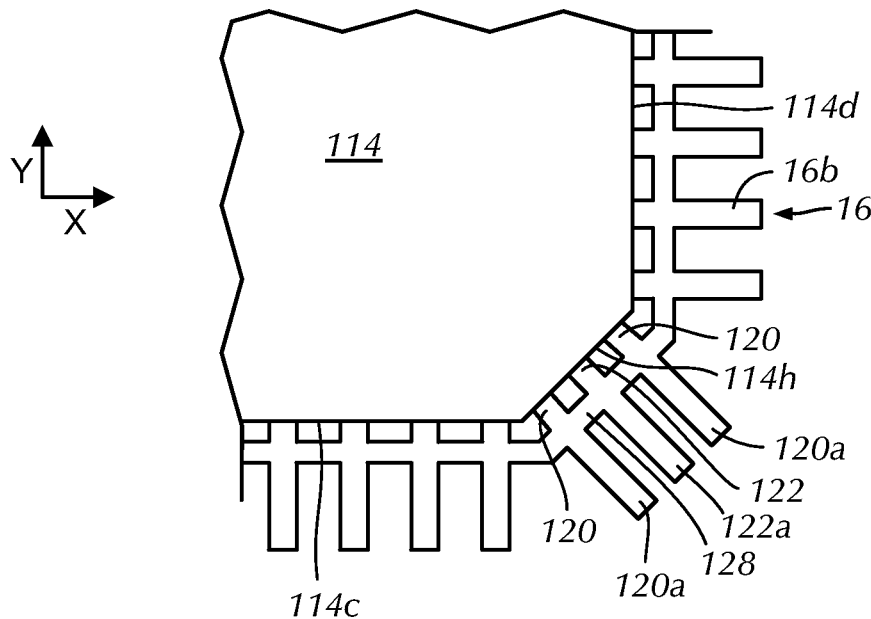
FIG. 6 is a partial top plan view of the structure of FIG. 5 following formation of a package casing.

FIGS. 5 and 6 are similar to FIGS. 2 and 3 in that they show a process for assembling the semiconductor device 110 in accordance with the second embodiment. The biggest difference is that the lead frame 126 is configured such that the exposed portions 120a, 122b of the power bar leads 120 and tie bars 122 extend past the respective dam bars 128. When the dam bars 128 are severed, the exposed portions 120a, 122b of the power bar leads 120 and tie bars 122 remain, as seen in FIG. 4, but remain electrically isolated from one another and the signal leads 116.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A semiconductor device, comprising:
   a semiconductor die;
   a package casing encapsulating the semiconductor die and lying in a plane defined by first and second orthogonal directions, the package casing having four main side walls each oriented generally parallel with one of the first or second directions;
   a plurality of signal leads electrically coupled to the semiconductor die and each having an embedded portion located within the package casing and an exposed portion extending from one of the main side walls of the package casing in a direction generally parallel with one of the first or second directions;
   one or more power bars electrically coupled to the semiconductor die and embedded in the package casing, each of the one or more power bars extending generally parallel to one of the first or second directions, each of the one or more power bars having at least one power bar lead at least partially embedded in the package casing and extending from the power bar at a generally non-zero angle with respect to the first and second directions, the one or more power bars and associated power bar leads being electrically isolated from the plurality of signal leads; and
   one or more tie bars, each of which is at least partially embedded in the package casing and extends at a generally non-zero angle with respect to the first and second directions, the one or more tie bars being electrically isolated from the plurality of signal leads and the one or more power bars and associated power bar leads.

2. The semiconductor device of claim 1, wherein the package casing further includes four corner side walls, each of which connects to two adjacent main side walls of the package casing and extends at a generally non-zero angle with respect to the first and second directions.

3. The semiconductor device of claim 2, wherein one of the one or more tie bars and at least one of the power bar leads each have an exposed portion extending outside of the package casing from one of the four corner side walls.

4. The semiconductor device of claim 3, wherein the exposed portion of the at least one of the power bar leads forms a power input/output connection to the corresponding one of the one or more power bars.

5. The semiconductor device of claim 3, wherein the exposed portion of the one or more tie bars forms a ground input/output connection for the semiconductor device.

6. The semiconductor device of claim 2, wherein an end of one of the one or more tie bars and an end of at least one of the power bar leads are each flush with one of the corner side walls of the package casing.

7. The semiconductor device of claim 1, wherein at least one of the power bar leads is parallel with one of the one or more tie bars.

8. The semiconductor device of claim 1, further comprising dielectric tape physically connecting the plurality of signal leads, the at least one power bar lead, and the one or more tie bars to one another.

* * * * *